United States Patent [19]

Hamano et al.

[11] Patent Number: 4,546,243

[45] Date of Patent: Oct. 8, 1985

[54] ELONGATED LIGHT RECEIVING ELEMENT ASSEMBLY

[75] Inventors: Toshihisa Hamano; Takeshi Nakamura; Hisao Ito, all of Kanagawa, Japan

[73] Assignee: Fuji Xerox Company, Limited, Japan

[21] Appl. No.: 389,357

[22] Filed: Jun. 17, 1982

[30] Foreign Application Priority Data

Jun. 23, 1981 [JP] Japan .................................. 56-95923

[51] Int. Cl.⁴ .............................................. H01J 40/14
[52] U.S. Cl. .................................. 250/211 R; 250/578
[58] Field of Search ............... 250/211 R, 578; 357/2, 357/24 LR, 30; 29/574, 575

[56] References Cited

U.S. PATENT DOCUMENTS

| | | | |
|---|---|---|---|
| 2,789,193 | 4/1957 | Anderson | 250/211 R |
| 2,956,171 | 10/1960 | Winder et al. | 250/211 R |
| 3,772,518 | 11/1973 | Muragama et al. | 250/211 R |
| 3,806,895 | 4/1974 | Tomisawa et al. | 250/211 R |
| 3,968,360 | 7/1976 | Monnier | 250/211 R |
| 4,368,523 | 1/1983 | Kawate | 29/575 |

Primary Examiner—David C. Nelms
Assistant Examiner—J. Gatto
Attorney, Agent, or Firm—Sughrue, Mion, Zinn, Macpeak, and Seas

[57] ABSTRACT

An elongated light receiving element is formed with a plurality of parallel one dimensional light receiving arrays or lines, each of which is lead out from a substrate. Each line is tested to determine which line or lines are free of defects, and the remaining lines are disconnected from the power source. The device serves to increase the production yield of such devices, which are prone to defects when manufactured in large sizes.

6 Claims, 9 Drawing Figures

ELONGATED LIGHT RECEIVING ELEMENT ASSEMBLY

BACKGROUND OF THE INVENTION

This invention relates to elongated one-dimensional light receiving element assemblies, and more particularly to an elongated light receiving element assembly which has a bit compensation means for improving the yield thereof.

A close contact type elongated one-dimensional light receiving element assembly using a non-crystalline film has been developed for use as a reading element in a facsimile device or the like, in order to make compact a device which uses no contracting optical system, and to thereby reduce the manufacturing cost thereof. However, it is considerably difficult to manufacture a sensor array having a width of "A4" (210 mm) or "B4" (256 mm), which are common paper sizes. Even in the case of a CCD or MOS type sensor which is much smaller in effective area than the elongated one-dimensional light receiving element assembly, it is considerably difficult to improve the yield in this respect.

With respect to the manufacture of a CCD or MOS type sensor array, a variety of methods of compensating for defective bits have been proposed and used. The concept of compensation has not been proposed for an elongated one-dimensional light receiving element assembly which is much larger in effective area than the aforementioned silicon single crystal element.

As is well known, the percentage of generation of defective bits increases exponentially with the area. Therefore, it is essential for an elongated one-dimensional light receiving element assembly much larger in area than a CCD type sensor array to have a structure for bit compensation, in order to improve the manufacturing yield.

SUMMARY OF THE INVENTION

In view of the foregoing, an object of this invention is to provide a bit compensation structure for an elongated one-dimensional light receiving element assembly.

The foregoing object of the invention has been achieved by the provision of an elongated light receiving element assembly which includes a substrate, first electrodes arranged in a first direction, a photo-conductor, and second electrodes arranged in a perpendicular direction and confronting the first electrodes so that light receiving elements are formed at the intersections of the first and second electrodes, which, according to the invention, further includes additional electrodes for bit compensation which are arranged in parallel with the second electrodes and also confront the first electrodes.

In the above-described assembly, a member of high electrical conductivity is preferably arranged in parallel with a portion of each of the second electrodes, to improve the electrical conductivity thereof.

As was described above, in the invention, one-dimensional light receiving elements are formed in a plurality of lines on one and the same substrate, and the bits on each line are tested, so that the line in which all the bits are satisfactory is used as a light receiving element line. The invention will now be described with reference to the accompanying drawings in detail.

DETAILED DESCRIPTION OF THE PREFERRED EMBODIMENTS

Figure 1:
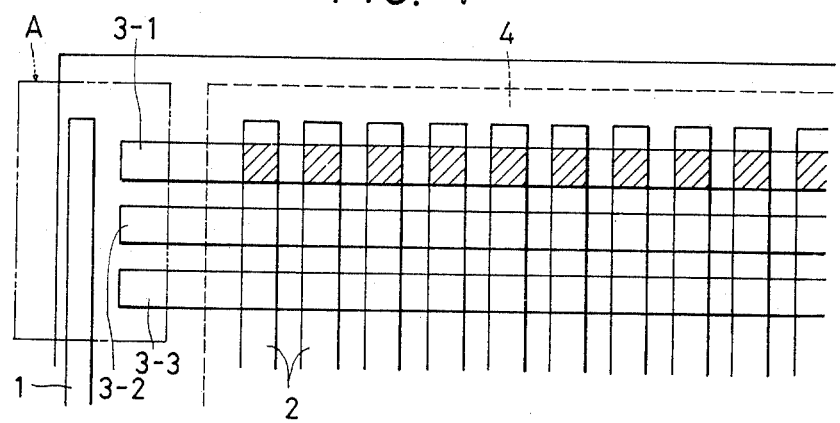
FIG. 1 is a plan view of a light receiving element assembly according to the invention.
Figure 2:
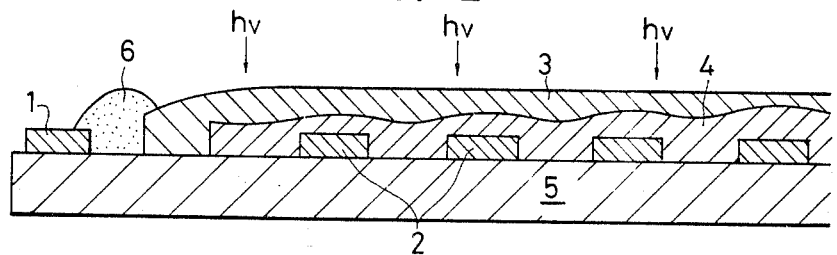
FIG. 2 is a sectional view of the assembly shown in FIG. 1.

FIG. 1 is a schematic diagram showing an elongated light receiving element assembly according to this invention. The structure of the assembly is of the sandwich type. In FIG. 1, reference numeral 1 designates an electric source line; and 2, electrodes arranged in the form of a pattern on a substrate. A photo-semiconductor 4 in the form of a film is formed in a manner so as to cover the electrodes 2, and film electrodes 3 (3-1, 3-2, and so on) are formed on the photo-semiconductor 4 in such a manner that they confront the electrodes 2.

Figure 3:
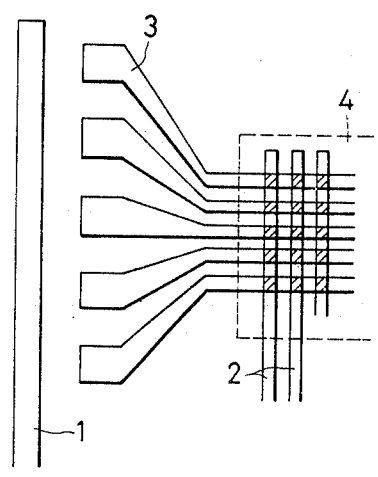
FIG. 3 and FIG. 4 are diagrams showing the extension of testing terminals.

In the above-described structure, light receiving elements are formed at the intersections of the electrodes 2 and 3. Aside from the confronted electrodes, several lines as described above are formed for bit compensation, as shown in FIG. 1, so that several one-dimensional light receiving element arrays are formed on one substrate. Then, the electric source line 1 and the electrode 3-1 arranged as shown in FIG. 3 are connected together by wire bonding or soldering 6, and the light receiving elements on the line 3-1 are checked for defects. If the line 3-1 is found defective, then the line 3-1 is disconnected from the electric source line 1 and the line 3-2 is connected to the electric source line 1, so that the light receiving elements on the line 3-2 are checked for defects. The lines are checked one after another as described above, to detect the lines which are free from detects, and the manufacturing yield of the elongated light receiving element assemblies is improved, as it is likely that at least one line will contain no defects.

Figure 4:
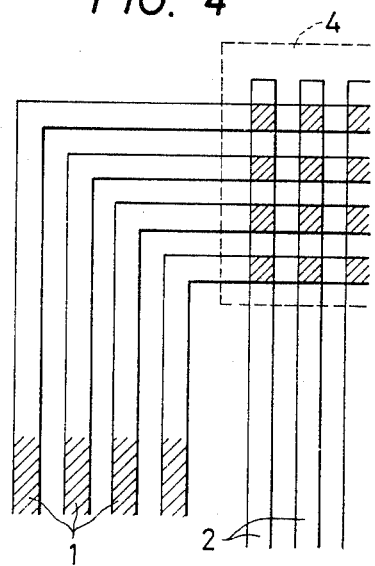

FIG. 4 shows another method of connecting lines to the electric source line. In this method, a connection pattern is formed in advance in such a manner that the lines are connected to the electric source line, and the lines are checked for defects one after another. If any line is found defective, it is then disconnected from the electric source line. The disconnection of the defective line from the electric source line is carried out by a conventional method (for instance by cutting it with a laser beam).

By way of example, the testing terminals may be formed as shown in FIG. 3 or 4. However, since the substrate is sufficiently large (due to the elongated light receiving element assembly), other methods may be employed to form the lead wires.

If, in the above-described method, the confronting electrodes are formed by photo-lithography, then a number of lines can be easily formed and an improvement in the yield can be expected.

Figure 7:
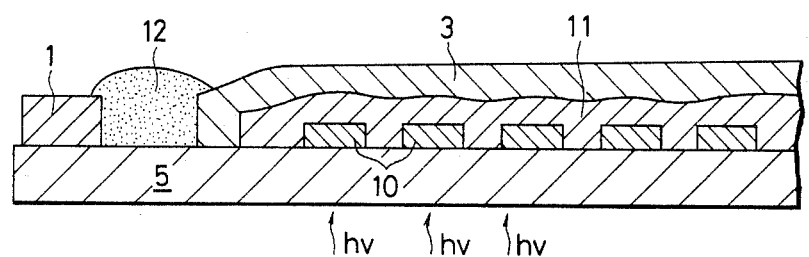
FIG. 7 is a diagram showing a light receiving element assembly of the sandwich type in which light is applied from the substrate side.
Figure 8:
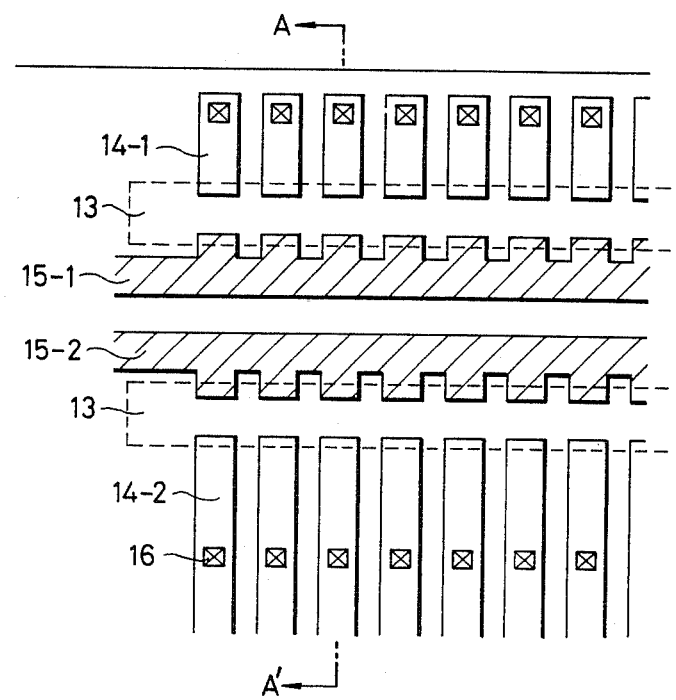
FIG. 8 is a diagram showing the arrangement of a light receiving element assembly of the planar type; and, FIG. 9 is a sectional view of the assembly of FIG. 8.
Figure 9:
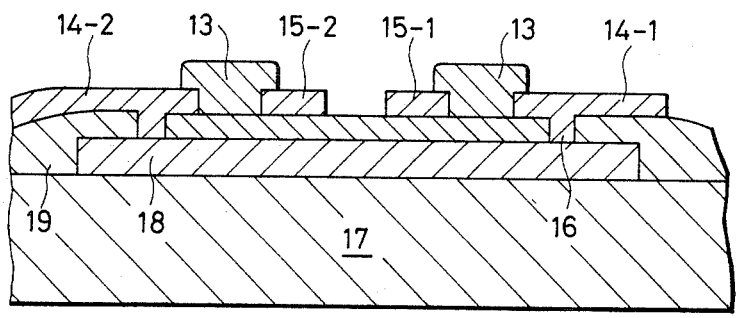

In the above-described light receiving element assembly of the sandwich type, light falls thereon from above. However, the technical concept of the invention can be applied to another example of a light receiving element assembly of the sandwich type as shown in FIG. 7, in which light is applied thereto from the substrate side, or to a light receiving element assembly of the planar type as shown in FIGS. 8 and 9. In this light receiving element assembly of the planar type, a plurality of electrodes 15-1, 15-2; 14-1, 14-2 are formed in the same plane, and light is applied thereto from above or below. In cases where a detecting signal is not generated due to the low sensitivity of the light receiving elements, or due to the poor connection of the electrodes (2,3) to the light receiving elements, such defects can be compensated in the manner described above.

However, the case where the electrodes are short-circuited by dust or the like must be handled with care.

Figure 5:
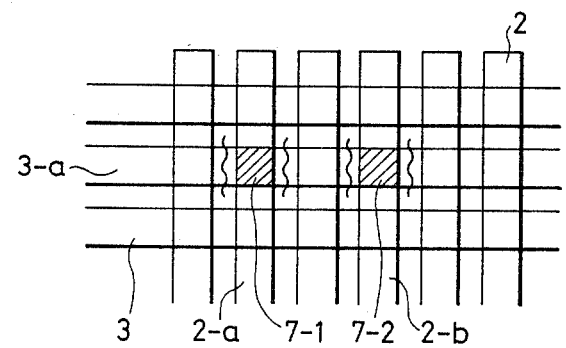
FIG. 5 is a diagram showing a compensation method in a case where at least two short-circuited bits are included in the light receiving element assembly.

If at least two light receiving elements are short-circuited in one line (as indicated at 7-1 and 7-2) as shown in FIG. 5 (no problem is caused when only one light receiving element is short-circuited), base electrodes 2-a and 2-b are completely short-circuited through the electrode 3-a, and therefore testing, etc. can no longer be carried out. Therefore, if at least two light receiving elements are short-circuited, it is necessary to cut the confronting electrode with a laser beam as indicated by the zigzag lines (    ) in FIG. 5.

Figure 6:
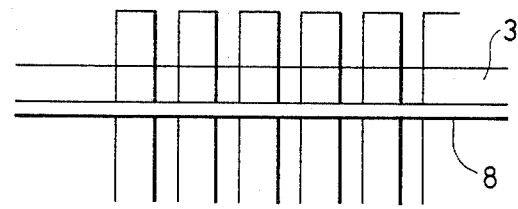
FIG. 6 is a diagram showing an electrode structure for improving the electrical conductivity of the confronting electrodes.

In general, the confronting electrode is low in electrical conductivity. Accordingly, if a thin (up to 100$\mu$ in width) confronting electrode is extended (up to 250 mm) over the substrate, its resistance will be several hundreds of megahoms (M$\Omega$). Therefore, in order to increase the electrical conductivity, a metal conductor (which is not transparent and, for instance, of Al) is formed, irrespective of the sensor area, in advance, and then a confronting electrode 3 is formed, the two being arranged as shown in FIG. 6.

As is apparent from the above description, according to the invention, the manufacturing yield of light receiving element assemblies can be increased, and accordingly the manufacturing cost is much lower than that of a light receiving element according to the conventional method.

In general, among the electrodes 2 and the confronting electrodes 3, those which are provided on the side to which light is applied should be transparent; however, a better effect can be obtained if both the electrodes 2 and the electrodes 3 are transparent.

Examples of the elongated light receiving element assembly according to the invention will now be described, to further describe the embodiments of the invention.

EXAMPLE 1

In the case of a light receiving element of the sandwich type in which light is applied from above and the substrate is of glass, the base electrodes are of aluminum.

To provide the base electrodes, aluminum is formed on the glass substrate 5 to a thickness of 4000 Å by an electron beam, and the aluminum film thus formed is cut into a predetermined electrode pattern by photo-lithography.

An amorphous silicon film is formed to a thickness of about 1$\mu$ by glow discharge, to provide the photo-conductor 4. The formation of the photo-conductor 4 is carried out for about one hour under the condition Ts= −200° to 300° C.; pressure=0.2 to 1 Torr; electrode-plate distance=40 mm; RF power=10 to 100 W; and the quantity of gas=50 SCC/M (SiH$_4$), where Ts is the substrate temperature, the RF power is of high frequency, and SCC/M stands for standard CC per minute (volume in the standard state). Then, a conductor 8 of high electrical conductivity is formed by vacuum-evaporating aluminum to a thickness of about 4000 Å with electron beams.

Thereafter, ITO (indium thin oxide In$_2$O$_3$) is vacuum-evaporated with a mask to a thickness of about 1500 Å (the O$_2$ partial pressure being $1.5 \times 10^{-4}$ Torr) by DC sputtering, to form transparent confronting electrodes 3. The elements thus formed (except the conductor 8) are as shown in FIG. 1.

Then, all the lines are tested by connecting them to the electrical source line 1 one after another.

EXAMPLE 2

In the case where the photo-conductor is of chalcogen;

a glass substrate ("Pyrex") is employed as the substrate 5, and the light receiving element surface is sufficiently polished.

The base electrodes 2 are of Cr-Au. More specifically, Cr and Au are vacuum-evaporated to thickness of up to 500 Å and 800 Å, respectively, on the glass substrate with electron beams, so that the resultant thickness is about 1300 Å. In succession, the Au-Cr layer is etched by photo-lithography to form the base electrodes 2 as required. Then, Se-Te-As is vacuum-evaporated to a thickness of about 2$\mu$ with a doping profile consisting of a carrier transferring layer and a carrier generating layer. More specifically, Se-As is vacuum-evaporated, as the carrier transferring layer, on the base electrode to a thickness of about 1$\mu$, and the resultant Se-As layer is doped with Te, so as to form an Se-Te-As layer 4 of 1$\mu$ in thickness. Thereafter Au is vacuum-evaporated to a thickness of 800 to 1500 Å through a mask with an electron beam, to form a conductor 8 of high electrical conductivity. Then, ITO is vacuum-evaporated to a thickness of about 1500 Å (the O$_2$ partial pressure being $1.5 \times 10^{-4}$ Torr) through a mask by DC sputtering, to form transparent confronting electrodes 3. These elements thus formed (except the conductor 8) are as shown in FIG. 1.

EXAMPLE 3

In the case of a light receiving element assembly of the sandwich type in which light is applied thereto from the substrate side (cf. FIG. 7), ITO (In$_2$O$_3$ 90%, and SnO$_2$ 10%) is vacuum-evaporated on a glass substrate 5 ("Pyrex") by sputtering. (In this connection, it is desirable that the ITO contain 70 to 90% In$_2$O$_3$ as described above, in order to facilitate etching in the photo-lithography process carried out later). Then, a predetermined pattern is formed by photo-lithography, to form the confronting electrodes 10 first.

Thereafter, aluminum is vacuum-evaporated with an electron beam to a thickness of about 4000 Å. In order to improve the electrical conductivity of the ITO as mentioned above, the portions of the confronting electrodes 10 other than the light receiving areas where the light receiving elements are formed are formed of aluminum. TKen, amorphous silicon 11 is vacuum-evaporated with a plasma CVD device under the same conditions as those in Example 1. Finally, an electric source line 1 and "base" electrodes 3 are formed by vacuum-evaporating through a mask and by photo-lithography. In this case, the mask is laid so that the vacuum-evaporated layer does not overlap the lead wires of the first layer 10, that is, the vacuum evaporation for the base electrode 3 is made on the amorphous silicon layer and is made to a portion where the electric source line should be formed. The plan view is the same as that in FIG. 1. However, it should be noted that the order of formation of the materials are opposite to that in FIG. 1.

EXAMPLE 4

In the case of a sensor of the planar type as shown in FIGS. 8 and 9, a ceramic substrate 17 is used. Aluminum is vacuum-evaporated through a mask to a thickness of about 4000 Å by electron beams, to form first layer electrodes 18. Then, an $SiN_2$ film is formed, as an inter-layer insulating film 19, by a plasma process. More specifically, discharge is carried out for about thirty minutes under the conditions that the substrate temperature is 300° C., $SiH_4$, $NH_3$ and $N_2$ are allowed to flow at rates of 10 to 20 SCC/M, 50 to 100 SCC/M and 250 SCC/M, respectively, the degree of vacuum is up to 1 Torr, the RF power is 100 to 150 W, and the inter-electrode distance is 20 mm; to form a $SiN_2$ film 19 7000 to 8500 Å in thickness.

Thereafter, the ordinary photolithography is carried out to form contact holes 16. Plasma etching is carried out with $CR_4+5\%$ $O_2$ gas for SiNx etching. With Al and SiNx, the etching selection ratio of Al to SiNx is sufficient. After the etching is carried out for about twenty minutes in this manner, the resist from the photo-lithographic process is burnt with plasma in an $O_2$ atmosphere to peel off the resist. In order to form the upper layer electrodes, aluminum is vacuum-evaporated to a thickness of about 4000 Å, and aluminum electrode patterns 14-1, 14-2 and 15-1, 15-2 are formed by ordinary wet photo-lithography. Then, amorphous silicon layers are formed by a plasma CVD device to provide photo-semiconductors 13. The discharge conditions in this case are the same as those in Example 1.

Thus, a light receiving element assembly as shown in FIG. 8 is formed. FIG. 9 is a sectional view taken along line A—A' of FIG. 8. In this example, two bit compensation lines are employed. However, it should be noted that the number of bit compensation lines can be increased by increasing the number of layers. The electric source line is processed similarly as in the light-receiving element assemblies of Examples 1, 2 and 3.

What is claimed is:

1. An elongated light receiving element assembly comprising; a substrate, first electrodes arranged in parallel in a first direction, a photo-conductor, and second electrodes arranged in parallel in a substantially perpendicular direction and confronting said first electrodes, such that light receiving elements are formed at the intersections of said first and second electrodes, a member of high electrical conductivity arranged in parallel with a portion of each of said second electrodes, to improve the electrical conductivity of said second electrodes, a power supply electrode disposed adjacent said first electrodes, and connected to a selected one of said second electrodes, said assembly further including means for bit compensation comprising said second electrodes arranged in a plurality of parallel rows confronting said first electrodes.

2. An assembly as claimed in claim 1, at least one of said first and second electrodes and said substrate being transparent.

3. An assembly as claimed in claim 1, said first and second electrodes being separated by said photo-conductor.

4. An assembly as claimed in claim 1, further including a plurality of power supply electrodes connected to said second electrodes to establish electrical connections, said connections being severed in dependence upon the quality of a given line of said light receiving elements.

5. An elongated light receiving element assembly comprising: a substrate; first and second sets of electrodes disposed on said substrate and arranged in parallel in a first direction; a pair of center electrodes disposed on said substrate arranged in a substantially perpendicular direction with respect to said first and second sets of electrodes to effect bit compensation; said center electrodes positioned between and confronting said first and second sets of electrodes; a photoconductive layer being disposed between said electrodes where said electrodes confront one another; electrical connections for establishing contact to selected ones of said electrodes.

6. An assembly as claimed in claim 5 further comprising a plurality of layers of said center electrodes.

* * * * *